United States Patent [19]

Young et al.

[11] Patent Number: 5,618,741
[45] Date of Patent: Apr. 8, 1997

[54] MANUFACTURE OF ELECTRONIC DEVICES HAVING THIN-FILM TRANSISTORS

[75] Inventors: Nigel D. Young, Redhill; John R. Ayres, Reigate, both of England

[73] Assignee: U.S. Philips Corporation, New York, N.Y.

[21] Appl. No.: 417,292

[22] Filed: Apr. 5, 1995

[30] Foreign Application Priority Data

Apr. 7, 1994 [GB] United Kingdom .................. 9406900

[51] Int. Cl.$^6$ .................................................. H01L 21/786
[52] U.S. Cl. .......................... 438/151; 438/163; 438/555; 438/535
[58] Field of Search ........................ 437/40 TFT, 41 TFT, 437/21, 157, 158, 174; 148/DIG. 150, DIG. 90, DIG. 91, DIG. 93

[56] References Cited

U.S. PATENT DOCUMENTS

| | | | |
|---|---|---|---|
| 4,351,674 | 9/1982 | Yoshida et al. | 437/19 |
| 4,381,202 | 4/1983 | Mori et al. | 437/17 |
| 5,130,829 | 7/1992 | Shannon | 359/59 |
| 5,132,753 | 7/1992 | Chang | 257/655 |
| 5,208,476 | 5/1993 | Inoue | 257/66 |
| 5,264,383 | 11/1993 | Young | 437/40 |
| 5,308,998 | 5/1994 | Yamazaki | 437/41 |

FOREIGN PATENT DOCUMENTS

| | | | |
|---|---|---|---|
| 0520560 | 12/1992 | European Pat. Off. | |
| 2208942 | 8/1990 | Japan | 437/40 TFT |
| 2291138 | 11/1990 | Japan | 437/41 TFT |
| 3194937 | 8/1991 | Japan | 437/909 |
| 130735 | 5/1992 | Japan | |
| 0582552 | 4/1993 | Japan | |
| 182983 | 7/1993 | Japan | |

OTHER PUBLICATIONS

"Excimer–Laser–Annealed Poly–Si Thin–Film Transistors" by S.D. Brotherton et al, IEEE Transactions on Electron Devices, vol. 40, No. 2, Feb. 1993, pp. 407–413.

Primary Examiner—Michael Trinh
Attorney, Agent, or Firm—Steven R. Biren

[57] ABSTRACT

In the manufacture of a large-area electronic device (e.g. an active-matrix liquid-crystal display or other flat panel display), a TFT of improved lifetime stability results from the inclusion of a field-relief region (22) which is of lower doping concentration than the drain region (12) and which is formed in an area (2) of lateral separation between the channel region (21) and the drain region (22). An energy beam (40), e.g. from an excimer laser, is used to provide the field-relief region (22), by laterally diffusing the doping concentration of the drain region (12) along an area (2) of the semiconductor film (20) significantly larger than the thickness of the semiconductor film (20). The method is simple and easily controllable, an advantageous doping profile (FIG. 3b) is obtained along the field-relief region (22) by this lateral diffusion. The laterally-diffused low-doping profile near the channel region (21) increases progressively along the current path to the drain region (12) so avoiding the creation of areas of high field in the separation area (2). Near the drain region the laterally-diffused doping concentration approaches in magnitude the high doping concentration of the drain region (12), so reducing the increase in drain series resistance resulting from the inclusion of the field-relief region (22). The lateral diffusion length is generally an order of magnitude larger than the depths of the drain and field-relief regions (12,22), because the thickness of the thin film(s) limits the vertical diffusion.

9 Claims, 3 Drawing Sheets

MANUFACTURE OF ELECTRONIC DEVICES HAVING THIN-FILM TRANSISTORS

BACKGROUND OF THE INVENTION

This invention relates to methods of manufacturing an electronic device which comprises a thin-film field-effect transistor (hereinafter termed "TFT"), the transistor having a field-relief region which is of lower doping concentration than its drain region and which is formed in an area of lateral separation between the channel region and the drain region. The invention also relates to electronic devices which comprise such a TFT. The device may be, for example, an active-matrix liquid-crystal display or other flat panel display, or any other type of large area electronic device with TFTs, for example, a thin-film data store or an image sensor.

There is currently much interest in developing thin-film circuits with TFTs on glass and on other inexpensive insulating substrates for large area electronics applications. Such TFTs fabricated with amorphous or polycrystalline semiconductor films may form the; switching elements of a cell matrix, for example, in a flat panel display as described in U.S. Pat. No. 5,130,829, the contents of which are hereby incorporated herein by reference. A recent development involves the fabrication and integration of circuits from TFTs (often using polycrystalline silicon) as, for example, integrated drive circuits for such a cell matrix. Unfortunately, instabilities occur in the transistor characteristics of such TFTs, especially those fabricated with polycrystalline silicon formed using low temperature processes. Several instability mechanisms occur, for example, bias-induced state creation in the polycrystalline silicon, and hot carrier induced state creation and carrier trapping. The degradation of the transistor characteristics (for example, off-state leakage current, threshold voltage and on-state current) can seriously limit the use of such TFTs in such circuits.

Published European Patent Application EP-A-0 520 560, which corresponds to U.S. patent application Ser. No. 08/471,803, discloses one way of reducing such instabilities of TFTs in an electronic device. The thin-film field effect transistor has a channel region in a first area of a semiconductor film between source and drain regions of the transistor; the transistor has a gate coupled to the channel region for controlling current flow along a current path between the source and drain regions; and a field-relief region of lower doping concentration than the drain region is formed in the current path at an area where the channel region is laterally separated from the drain region. The whole contents of Ser. No. 08/471,803 (EP-A-0 520 560) are hereby incorporated herein by reference.

In the method of manufacture disclosed in EP-A-0 520 560, the drain region is formed by depositing a highly-doped semiconductor layer on an intermediate semiconductor layer on the face of the semiconductor film which provides the channel region. The intermediate layer is doped with a lower conductivity-determining dopant concentration than the highly-doped layer. Part of the highly-doped layer is removed from the intermediate lower-doped layer (over an area corresponding to the width of the channel region and a length typically in excess of 1 μm) so as to laterally separate the drain region from the transistor channel region and thus to form an area of the intermediate layer which is not overlapped by the drain region. This non-overlapped area of the intermediate layer is not modulated by the gate and provides the field-relief region. The resulting device structure is highly successful in reducing the TFT instabilities.

However, considerable care is needed in this known manufacturing method in determining the end-point of the two etching steps, namely when to stop the etch-removal of the highly-doped drain region layer from the intermediate, lower-doped layer and when to stop the etch-removal of the intermediate, lower-doped layer from the semiconductor film. These end-points are normally set by performing each etching treatment for a pre-calculated time.

SUMMARY OF THE INVENTION

It is an aim of the present invention to provide a simpler, more easily controllable method of fabricating a TFT with a drain field-relief region and also to provide a TFT device structure which includes a drain field-relief region having even more advantageous characteristics.

According to one aspect of the present invention, there is provided a method of manufacturing an electronic device comprising a thin-film field-effect transistor having a channel region in a first area of a semiconductor film between source and drain regions of the transistor, a gate coupled to the channel region for controlling current flow along a current path between the source and drain regions, and a field-relief region which is of lower doping concentration than the drain region and which is formed in the current path at an area where the channel region is laterally separated from the drain region, which method in accordance with the present invention is characterized in that a second area of the semiconductor film is provided for the current path where the channel region is laterally separated from the drain region, and a lateral diffusion doping step is carried out by heating the; drain region and the second area with an energy beam to an extent sufficient to form the field-relief region in this second area by laterally diffusing a doping concentration of the drain region into this second area of the semiconductor film along a distance which is larger than the thickness of the semiconductor film.

A simplified method of manufacture is obtained by the use of a laser beam (or other energy beam) to provide the field-relief region, by laterally diffusing the doping concentration of the drain region in the second area of the semiconductor film. This field-relief region can be obtained in a more controllable manner, without needing to perform two etching treatments for pre-calculated times. Furthermore an advantageous doping profile is obtained along the field-relief region by this lateral diffusion in the semiconductor film. Thus, the laterally-diffused low-doping profile near the channel region increases progressively along the current path to the drain region to avoid the creation of areas of high field in the separation area between the channel region and the drain region. Near the drain region the laterally-diffused doping concentration approaches in magnitude the high doping concentration of the drain region, thus reducing the increase in drain series resistance resulting from the inclusion of the field-relief region.

Thus, according to another aspect of the present invention there is provided an electronic device comprising a thin-film field-effect transistor having a channel region in a first area of a semiconductor film between source and drain regions of the transistor, a gate coupled to the channel region for controlling current flow along a current path between the, source and drain regions, and a field-relief region which is of lower doping concentration than the drain region and which is present in the current path at an area where the channel region is laterally separated from the drain region, which device in accordance with the invention is characterized in that the field-relief region extends along at least a part of a second area of the semiconductor film, which second area laterally separates the channel region from the drain region, and the doping concentration of the field-relief region increases progressively along the current path in the second area of the semiconductor film to the drain region over a distance which is larger than the thickness of the semiconductor film and in a manner which corresponds to a diffusion profile from the drain region.

The drain region and the second area of the semiconductor film may be defined in various ways to laterally separate the first area of the film (the channel region) from the drain region. The doping concentration of the drain region may be provided by deposition or implantation. Its lateral extent may be defined by etching or by masking.

The doping concentration of the drain region may be formed from a highly-doped layer which is deposited and localized (e.g. by etching) on the surface of a device substrate before depositing the semiconductor film on the substrate. An etching treatment may be used which is selective between the semiconductor material of the highly-doped layer and the underlying material at the substrate surface (usually an insulating material with perhaps a deposited metal-film connection thereon). In this case, the heating step with the energy beam is carried out in such a way that the doping concentration in the underlying highly-doped layer diffuses both upwards and sidewards in the semiconductor film on the substrate. Thus, for example,, when the energy beam results in a rapid temporary melting of part of the film, the melt depth may be arranged to extend across the thickness of the film to the underlying highly-doped layer.

The drain region may be formed from a highly doped layer which is deposited or implanted at the surface of the semiconductor film. Generally, the semiconductor film which provides the transistor channel region will be of intrinsic conductivity type with no significant doping. An easier end-point control of the etching away of a highly-doped drain-region layer from such an intrinsic semiconductor film is possible, as compared with etching away such a layer from a intermediately-doped intermediate layer and when etching away the intermediately-doped intermediate layer from the intrinsic semiconductor film. The etching away may be carried out at both the first and second areas of the semiconductor film, after which the gate may be provided on an insulating layer on the first area of the semiconductor film. However, the gate may be provided on the device substrate before depositing the semiconductor film for the channel region or before depositing a highly-doped layer for the drain region. In all these cases, the gate is so arranged in relation to the other regions that it does not modulate the field-relief region located in the second area of the semiconductor film. There may be a slight overlap between the gate and the low doping concentration edge of the field-relief region adjacent to the intrinsic channel region. In this case, the overlapped part of low doping concentration effectively forms a part of the channel region modulated by the gate.

In another form, the doping concentration of the drain region may be provided by dopant ion implantation, while using an implantation mask over the first and second areas of the film. Such an implantation mask is wider than the desired gate of the TFT. The implantation mask may comprise a gate layer from which the gate is formed by etching away the gate layer from over the second area of semiconductor film; this etching may be carried out either before or after the lateral diffusion doping step with the energy beam. The heating effect of the energy beam (which laterally diffuses the implanted doping concentration into the second area of the semiconductor film) also naturally serves to activate the implanted dopant concentration in the drain region of the semiconductor film. In order to provide a simple and self-aligned process for defining the gate from such a gate layer, the implantation mask may comprise a resist layer on the gate layer, and the gate may be formed by etching the gate layer from under an edge of the resist area before the drain region is heated with the energy beam.

In this context, it may be noted that it is known to ion implant the dopant for source and drain regions of a thin-film field-effect transistor and then to laser anneal the implantation damage of the semiconductor crystalline film so as to activate the implanted dopant for n-type or p-type conductivity in the semiconductor. A resist layer on the gate layer may serve as an implantation mask, and this gate layer may be present during the laser anneal. In this case, when the implantation occurs at oblique angles, unannealed implantation damage may remain in a short area (typically 0.2 μm to 0.5 μm long) of the semiconductor film where shielded under the mask edge from the laser beam. This unannealed area in the current path of the transistor can seriously reduce the ON-current of the transistor. This problem is overcome by adopting additional process steps as disclosed in published Japanese patent applications Kokai Nos. JP-A-05-82552 and JP-A-05-182983, the whole contents of which are hereby incorporated herein as reference material. These process steps of JP-A-05-82552 and JP-A-05-182983 involve (a) etching back the gate layer from under the edge of the photoresist before the laser anneal step, and (b) removing the photoresist before the laser anneal step so that this area also is exposed to the laser pulse during the laser anneal step. In this manner the implanted dopant in this previously-masked area is activated by the laser annealing. However, unlike the present invention, the duration of the laser treatment in JP-A-05-82552 and JP-A-05-182983 is insufficient to laterally diffuse the activated dopant over a distance forming a field-relief region from the drain region.

In accordance with the present invention, the intensity and duration of the heating treatment with the energy beam is sufficient to laterally diffuse the dopant from the drain region over a distance typically of at least a micrometer (micron) for forming the field-relief region of the thin-film transistor. Thus, the length of the field-relief region is typically of the order of a micrometer (micron), for example from about 1 μm to several micrometers. For most TFTs, the length of the field-relief region (and hence the distance along which the drain dopant is laterally diffused) may be an order of magnitude greater than the thickness of the semiconductor film. In general, the thickness of the semiconductor film of most TFTs is so small (in comparison with the desired extent of lateral diffusion for the field-relief region) that, at least after the lateral diffusion doping step with the energy beam, the doping concentrations of the drain region and the field-relief region usually extend across the thickness of the semiconductor film. Thus, the depth of the drain region and field-relief region is determined by the film thickness, whereas the length of the field-relief region is determined by the lateral diffusion; in this situation the vertical doping profile is mostly uniform at any given cross-section of the drain field-relief region across the thickness of the semiconductor film. Thus, the drain series resistance can be reduced by the whole thickness of the semiconductor film uniformly accommodating the current path in the field-relief region and drain region, so reducing current crowding effects. Furthermore as already stated, an advantageous progressive doping profile is obtained along the current path in the field-relief region by the lateral diffusion from the drain region.

The doping concentration of the drain region may be laterally diffused in the semiconductor film to such an extent that the field-relief region occupies the whole length of the (separation) second area between the channel region and the drain region. In this arrangement, the increase in drain resistance due to the inclusion of the field-relief region is minimised. However, the lateral diffusion may be over a shorter length than the separation between the channel region and the drain region. In this case, an undoped area of the semiconductor film may be retained between the channel region and the field-relief region, and such an undoped area can be advantageous in a TFT supporting high voltages.

The energy beam may have an absorption depth in the drain region less than the thickness of the drain region. In this situation, a vertical melting profile in the drain region and the semiconductor film can be controlled, and undesirable excessive heating of the substrate can be avoided. Quite a precise control for this purpose can be obtained when the energy beam is of an ultraviolet wavelength generated by a pulsed excimer laser. However, other energy beams may be used as the heating source, for example flash exposures with high intensity lamps (e.g. ultraviolet lamps) or even a high power electron beam.

BRIEF DESCRIPTION OF THE DRAWINGS

These and other features of the present invention, and their advantages, are illustrated specifically in embodiments of the invention now to be described, by way of example, with reference to the accompanying diagrammatic drawing, in which.

It should be noted that all the drawings are diagrammatic and not drawn to scale. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

The TFTs manufactured in accordance with these embodiments of FIGS. 1 to 4 and FIGS. 5 and 6 and FIGS. 7 to 11 form part of a large-area electronic device, for example, a flat panel display as illustrated in U.S. Pat. No. 5,130,829, or a large-area image sensor, or a data store. The device has a substrate 10 on which thin-film circuitry is formed, for example, a matrix of TFT switching transistors and TFT drive circuits. In the case of a flat panel display as described in U.S. Pat. No. 5,130,829, the substrate 10 may be a back plate of the display. The device substrate 10 is electrically insulating at least adjacent to its top surface. The substrate 10 may comprise a glass or another low-cost insulating material. In a particular embodiment, it may comprise an upper layer of silicon dioxide on a glass base. In most typical cases, the substrate 10 is only capable of withstanding temperatures of less than 700° C. (Celsius), for example up to about 625° C. for a glass of moderate quality and cost or as low as about 200° C. for a poorer quality glass or for a plastics material. A large number of the individual TFTs are generally formed side by side on the device substrate 10 and are interconnected by thin-film conductor patterns extending on the substrate 10.

Figure 2:
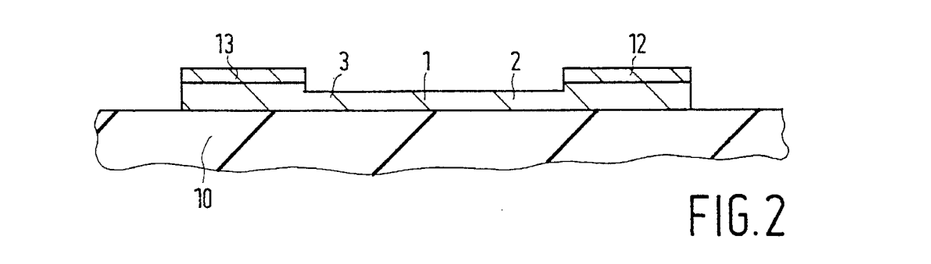
Figure 3A:
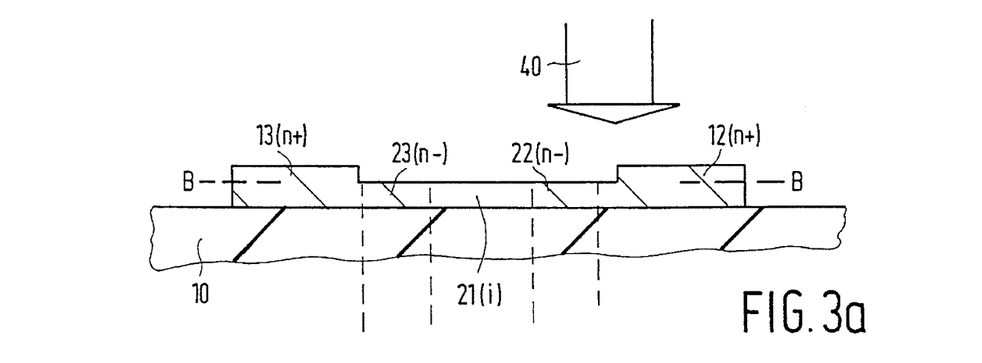
Figure 3B:
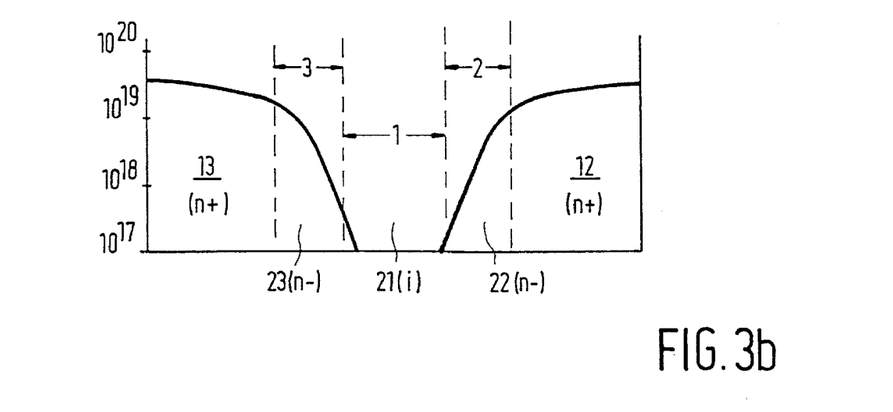
Figure 4:
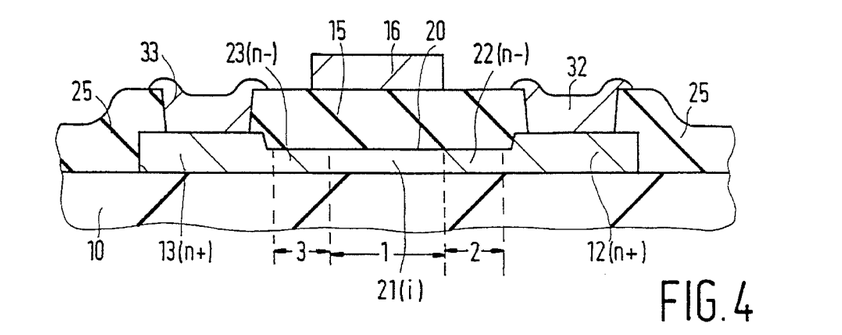
Figure 10:
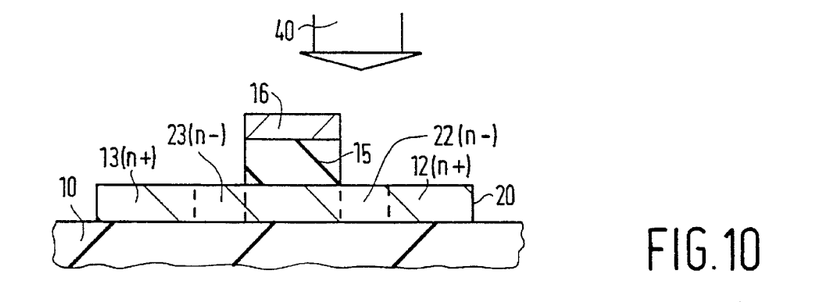
Figure 11:
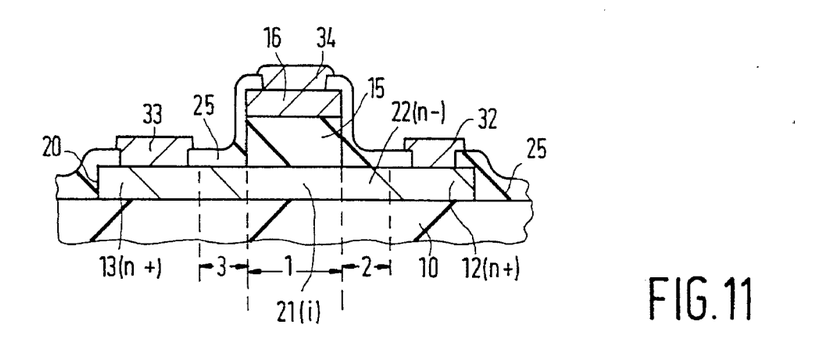

FIG. 4 illustrates the TFT which results from carrying out the manufacturing method of FIGS. 1 to 4. FIG. 6 illustrates the TFT which results from carrying out the manufacturing method of FIGS. 5 and 6. FIG. 11 illustrates the TFT resulting from the method of FIGS. 7 to 11. These transistors each have a channel region 21 in a first area 1 of a semiconductor film 20 between source and drain regions 13 and 12 respectively of the TFT. A gate 16 is coupled to the channel region 21 across a dielectric layer 15 to control current flow along a current path between the source and drain regions 13 and 12. A field-relief region 22 of lower doping concentration than the drain region 12 is formed in the current path at an area 2 where the channel region 21 is laterally separated from the drain region 12. The gate 16 modulates the channel region 21 to control the current flow through the TFT but does not modulate the field-relief region 22. The length of the field-relief region 22 is typically about 1 μm or more, and its width corresponds to the width of the channel and drain regions 21 and 12.

In accordance with the present invention, a second area 2 of the semiconductor film 20 accommodates the current path at the area where the channel region 21 is laterally separated from the drain region 12; the field-relief region 22 extends along the second area 2 of the semiconductor film 20; and the doping concentration of the field-relief region 22 increases progressively along the current path in this second area 2 to the drain region 12 over a distance which is larger than the thickness of the semiconductor film and in a manner which corresponds to a diffusion profile from the drain region 12, see FIG. 3b. The field-relief region 22 is formed in accordance with the invention by laterally diffusing a doping concentration of the drain region 12 into this second area 2 of the semiconductor film 20 along a distance typically in excess of 1 μm, upon heating the drain region 12 with an energy beam 40, see FIG. 3a, FIG. 5, and FIG. 10.

In typical specific examples of the TFTs of FIGS. 4, 6 and 11, the film 20 may be of substantially intrinsic polycrystalline silicon having a thickness in the range of about 60 nanometers (nm) to 0.1 micrometers (μm). The length of the area 1 of this intrinsic material which provides the channel region 21 may be about 3 μm to 20 μm, depending on the desired transistor characteristics. The field-relief region 22 in doped area 2 of this film 20 may have a doping concentration (for example of phosphorous) which increases progressively from about $10^{17}$ cm$^{-3}$ near the channel region to about $10^{19}$ cm$^{-3}$ near the drain region, the increase being over a length in the range of about 1 μm to 5 μm along the area 2. The drain region has a higher uniform doping concentration, for example about $5\times10^{19}$ cm$^{-3}$ or more. In the embodiments of FIGS. 1 to 11, at least after heating with the energy beam 40, the doping concentration of both the drain region 12 and the field relief region 22 extend across the thickness of the semiconductor film 20.

The length of the gate 16 is directly related to the length of the channel region and may be, for example, about 5 μm to 25 μm. In the embodiments of FIGS. 4 and 6, a separate mask alignment is required to position the gate 16, and so a slight overlap (e.g. of about 1 μm) of the gate 16 with the doped region 22 is usually made to ensure that the gate 16 modulates the whole channel region 21. The overlapped edge part of the doped region 22 is modulated by the gate 16 and so does not function as part of the field-relief region 22 in the unmodulated area 2. In the embodiment of FIG. 11, a self-aligned masking process may be used to form the gate 16, and so no significant overlap of the gate 16 with the doped region 22 is needed.

In the embodiments of FIGS. 4, 6 and 11, a low-doped region 23 similar to the field-relief region 22 is provided in an area 3 of the film 20. This area 3 separates laterally the source region 13 from the channel region 21. The TFTs of FIGS. 4, 6 and 11 are thus symmetrical with respect to their source and drain regions 13 and 12.

The embodiment of FIGS. 1 to 4 will now be described in more detail. On the device substrate 10, a semiconductor crystalline film 20 of silicon is deposited for providing the channel regions 21 of the TFTs to be formed on the substrate 10, of which FIG. 4 shows just one TFT. The silicon film may be deposited by a low pressure chemical vapor deposition (LPCVD) process or a plasma-enhanced chemical vapor deposition (PECVD) process. At a deposition temperature of about 620° C. with LPCVD or 350° C. with PECVD, a polycrystalline silicon film is provided in situ on the substrate. With a lower temperature (eg less than 550° C. with a LPCVD process, or between 200° C. and 300° C. with a PECVD process) amorphous silicon material is deposited. This amorphous silicon material may be crystallized into polycrystalline material in known manner, by heating the structure in a furnace to about 600° C. or by heating the film with a laser beam. The crystallization of the amorphous silicon film with a laser beam may be effected at the lateral diffusion doping stage illustrated in FIG. 3a, and/or it may be effected at an earlier stage such as immediately after depositing the amorphous silicon. It is also possible to use a very low cost process (such as evaporation or sputter deposition) to deposit the silicon material which is then crystallized to better quality material in such a heating step.

Figure 1:
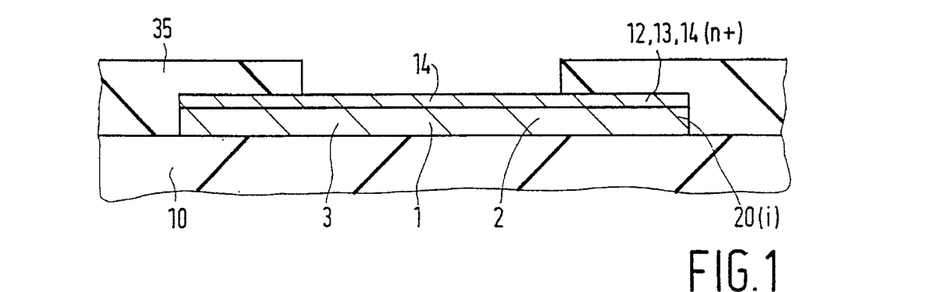
FIGS. 1 to 4 are cross-sectional views of a TFT structure at successive stages in its manufacture by a method in accordance with the present invention.

Because the crystallization heating step can be carried out before providing any of the other regions of TFT (ie the, source 13, drain 12, or gate 16), there is considerable freedom for optimizing the deposition and/or subsequent heating parameters so as to obtain the desired crystalline quality for the silicon film in accordance with acceptable process costs for the particular electronic device being manufactured. Nonetheless, the resulting polycrystalline silicon film 20 is still of a disordered lattice material and generally has intrinsic type conductivity due to the high density of trapping states within the energy band gap. These trapping states result from the presence of crystal defects at grain boundaries of the material and within the grains themselves.

in the arrangement depicted for FIG. 1, there has then been deposited on the upper surface of the film 20 a silicon electrode layer 12, 13, 14 having a high doping concentration (for example, of phosphorus) for the source and drain regions 13 and 12. This layer 12, 13, 14 may be deposited on the film 20 in known manner, for example by plasma-enhanced chemical vapor deposition. In the form illustrated in FIG. 1, this highly-doped layer is provided as a blanket layer over the whole upper surface of the film 20. Its thickness may be about half that of the film 20, for example about 50 nm.

As illustrated in FIG. 2, a resist mask 35 is then formed on the highly-doped layer 12, 13, 14, after which the exposed part 14 is etched away from the areas 1, 2 and 3 of the film 20. A plasma etching process may be used. When the part of the film 20 exposed by the etching is of the desired thickness for the channel region 21, then the etching is terminated. The end-point may be determined by etching for a pre-calculated time. However it is also possible to detect the etching transition from the heavily-doped (phosphorus) layer 14 to the undoped (intrinsic) film 20, for example by observing the optical emission from the plasma or by residual gas analysis.

The source and drain regions 13 and 12 of the resulting structure are now heated with the energy beam 40 for a sufficiently long time as to effect the lateral diffusion for forming the field-relief regions 22 and 23, as illustrated in FIG. 3a and 3b. Preferably the beam 40 is a pulsed laser beam of ultraviolet wavelength generated by an excimer laser. Thus, for example, a 248 nm wavelength from a pulsed KrF laser may be used, or a 308 nm wavelength from a XeCl laser. Its absorption depth in the layer 12, 13 is much less than the thickness of the layer 12, 13. For the ultraviolet wavelength examples given, the absorption depth is typically about 6 nm (60 angstroms). The pulse duration may be of the order of several tens of nanoseconds, for example about 50 ns. By varying the incident laser energy in the range 200 to 500 mJ.cm$^{-2}$ per pulse, the depth over which the silicon material is melted can be varied from about 10 nm (100 angstroms to 100 nanometers (1000 angstroms). The duration of the temporary melt can be controlled by the incident laser energy per pulse, with a repeat rate determined by the pulse frequency. The duration of the resulting diffusion is in general slightly longer than the melt duration but is of the same order of magnitude. In order to obtain a long lateral diffusion of the dopant (for example, in the range of 1 µm to 5 µm from the drain region 13), a long total exposure time to the short laser pulses is needed using multiple exposure with, for example, several hundred pulses. A slow scan with overlapping pulse exposures may be used. In this manner, the diffusion characteristics and hence the lateral doping profile resulting from this heating step can be controlled.

A suitable commercially available equipment for this purpose is the ELA9100 excimer laser annealing system, from XMR Inc of Santa Clara, Calif., USA. This equipment has a XeCl (308 nm) laser producing pulses with a rectangular intensity shape ("top hat" profile), which is preferable to the more conventional Gaussian intensity profile. The pulse width is 45 nsec, and the maximum pulse repetition rate is 300 Hz. The pulse energy is 500 mJ.cm$^{-2}$, and the beam size is variable from 3 mm×3 mm to 65 mm×65 mm to 3 mm×65 mm.

FIG. 3b illustrates an example of the resulting doping profile, taken along the plane B—B in the thin-film structure 12, 13, 20 of FIG. 3a. Because the lateral diffusion distance (1 µm to 5 µm) is an order of magnitude larger than the thickness (e.g. 0.1 µm) of the film 20, this FIG. 3b doping profile in the plane B—B occurs throughout the thickness of the film 20 between the opposite faces of the film areas 1, 2, 3. As can be seen from FIG. 3b, the doping concentration falls off gradually in a diffusion profile from a level of more than $10^{19}$ cm$^{-3}$ near the source and drain regions 13 and 12 to about $10^{17}$ cm$^{-3}$ near the channel region 21.

An insulating layer 25 is then deposited on the silicon thin-film structure 12, 13, 20 to provide inter alia the gate dielectric 15. Photolithographic and etching steps are then carried out to form contact windows in the insulating layer 25, after which a metal film is deposited and photolithographically defined to provide the gate 16, source and drain contacts 33 and 32, and a pattern of conductor tracks for interconnecting the TFTs of a circuit. The final resulting structure is illustrated in FIG. 4.

Figure 5:
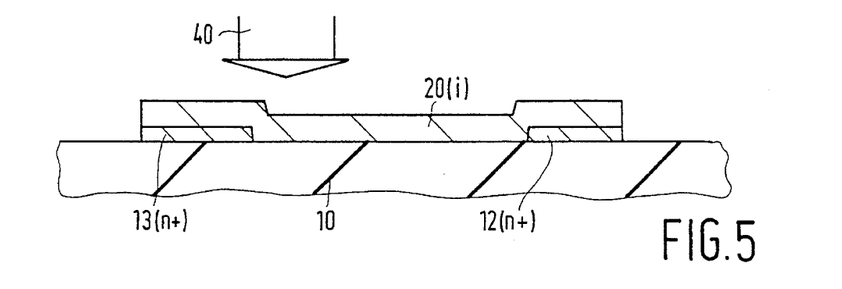
FIGS. 5 and 6 are cross-sectional views of another TFT structure at successive stages in its manufacture by a modified method also in accordance with the present invention.
Figure 6:
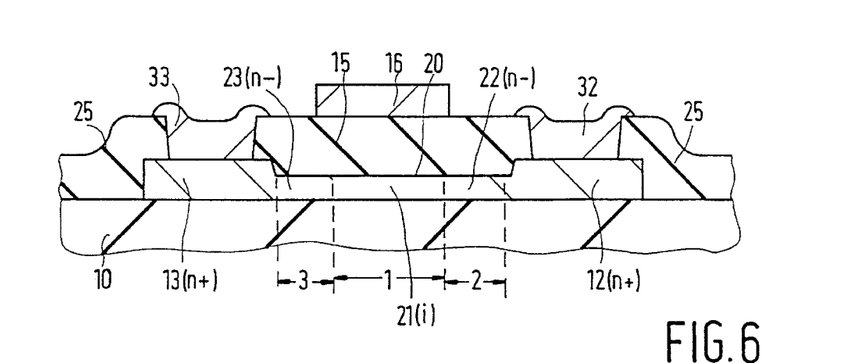

FIGS. 5 and 6 illustrate a modification in the manufacture which results in a similar TFT but which avoids a need to etch the doped layer 22 from the intrinsic film 20. In this case the highly-doped layer 12, 13, 14 is deposited directly on the substrate 10. A similarly-masked etching step is then carried out to define the local source and drain region areas 13 and 12, after which the intrinsic film 20 is deposited. In this case, the intrinsic film 20 may be deposited to have a small precisely-determined thickness for the channel region 21, which is advantageous in reducing leakage currents and photosensitivity in the TFT.

In the heating step (FIG. 5) with the laser beam 40, the doping concentration from these source and drain regions is now diffused (a) across the thickness of the film 20 to provide the source and drain regions at the upper surface of the film 20 and (b) laterally into the areas 3 and 2 to form the lower-doped regions 23 and 22. In this case the melt depth is arranged to extend temporarily through the thickness of the film 20 to the source and drain region areas 13 and 12. This heating step with the beam 40 may also serve to crystallize the film 20 or to improve the crystal quality of the film 20.

An insulating film 25 and metal film are then deposited and photolithographically defined to provide the gate 16, source and drain contacts 33 and 32, and the pattern of conductor tracks interconnecting the TFTs of the circuit. In a modification of this method, the insulating layer 15 may be formed on the film 20 before the lateral diffusion doping step with the laser beam 40. If the film 20 is already of suitable crystalline material, then the gate 16 may be present on the insulating layer 15 on the film 20. In general, a metal layer or other conductive layer (such as the layer used to provide the gate 16) can mask the underlying thin-film structure against an excimer laser beam 40.

It should be noted that it is generally less desirable to mask the channel region 21 against the laser beam 40 during the lateral-diffusion doping step with the beam 40. Thus, when the channel region 21 is so masked (by the gate 16 in a modified form of FIG. 5 or in the following FIG. 10), the molten zone formed by the beam 40 does not generally extend into the channel region 21 and so there is a high temperature gradient in the semiconductor film 20 at the interface between regions 21 and 22. As a result of this high temperature gradient the lateral diffusion of dopant to form the field-relief region 22 may be slower than is the case when all the regions 21,22 and 12 are molten through exposure to the beam. Thus, generally a higher intensity beam 40 applied for a longer duration (for example a much larger number of high intensity pulses) is required to form the laterally-diffused field-relief region 22 when the laser treatment is carried out in the presence of the gate 16.

The embodiment of FIGS. 7 to 11 will now be described in detail. In the specific example illustrated for this method, an insulated gate structure 25, 26 is formed on the film 20 before the lateral diffusion doping step with the laser beam 40 so that a self-alignment process may be used to define the insulated gate 15, 16.

Figure 7:
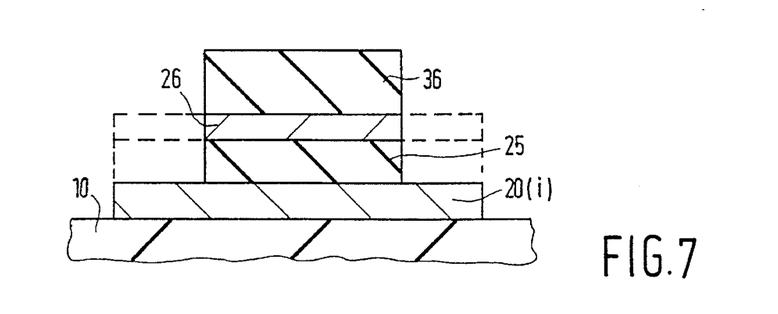
FIGS. 7 to 11 are cross-sectional views of a different TFT structure manufactured by yet another method also in accordance with the present invention.

On the device substrate 10 of FIG. 7, a semiconductor film 20 of polycrystalline silicon is formed for providing the channel regions 21 of the TFTs in a similar manner to that of FIG. 1. An insulating film 25 is then deposited on the silicon film 20 and a gate layer 26 is deposited on the insulating film 25. Using a photolithographic and etching step, an implantation mask 25, 26, 36 is now formed on the silicon film 20. This implantation mask comprises the gate layer 26 on the insulating layer 25 on the first, second and third areas 1, 2, 3 of the semiconductor film 20. In the specific example of FIGS. 7 to 11, a photoresist layer 36 which was used for the etch definition of the gate layer 26 and insulating layer 25 is retained on the gate layer 26 as part of the implantation mask. Dopant ions 42 (for example of phosphorous or arsenic) are now implanted in the semiconductor film 20 to provide the doping concentration of the source and drain regions 13 and 12, while using the implantation mask 25, 26, 36 to mask the areas 1, 2, 3 of the film 20.

Figure 8:
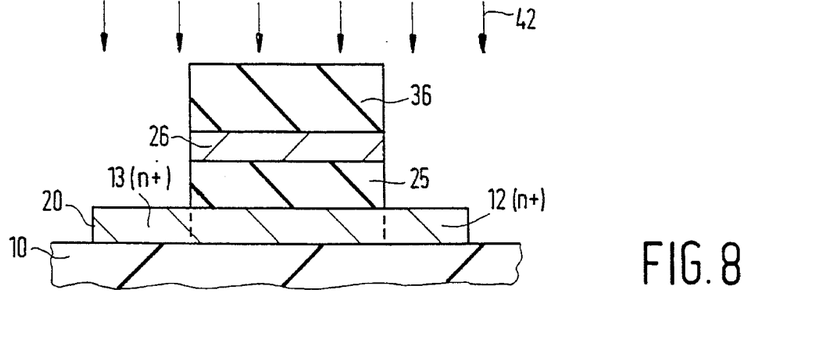
Figure 9:
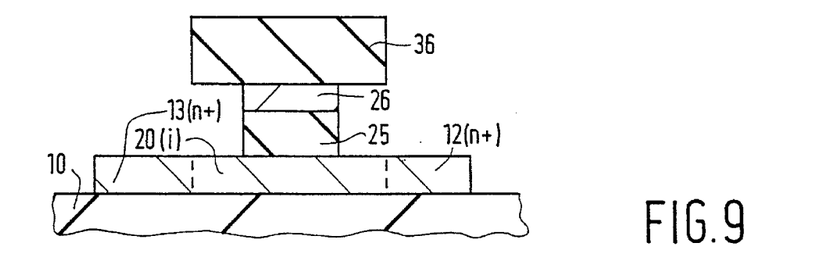

The gate 16 of the TFT is now formed from the gate layer 26 by etching away the gate layer 26 from over the second and third areas 2 and 3 of the film 20. The etch-removal is carried out over a considerable distance (in the range of 1 μm to 5 μm) corresponding approximately to the desired length of the field-relief region 22. This etching can be carried out in a self-registered manner using the resist 36 as the mask. Thus, the gate 16 is formed by etching the gate layer 26 from under an edge of the photoresist layer 36. The resist 36 is now removed, and the thin-film structure is heated with the laser beam 40 to laterally diffuse the implanted doping concentrations into the areas 3 and 2 to form the lower-doped regions 23 and 22. Preferably the dopant is laterally diffused over a distance which corresponds almost exactly to the distance over which the gate layer 26 was etched back below the resist 36. In this way a self-aligned TFT structure is obtained. The heating also activates the implanted dopant concentration to form the source and drain regions 13 and 12. However, the duration of the laser heating treatment (as determined by the total number of pulses to which each region is exposed) in order to achieve the desired extent of lateral diffusion is orders of magnitude higher than that required merely to activate the implanted dopant.

The thin-film structure is now coated with an insulating film in which contact windows for the source 13, gate 16 and drain 12 are formed in photolithographic and etching steps. A metal film is then deposited and defined photolithographically to form the contacts 33, 34 and 32 and the interconnections of the TFTs. The resulting structure is illustrated in FIG. 11.

Thus, each of the TFTs of FIGS. 4, 6, and 11 has a laterally-diffused drain field-relief region 23, as a result of which the; degradation of the transistor characteristics is significantly reduced. A measure of degradation can be obtained from the reduction which occurs in the saturation ON current of the TFT during the operational life of the TFT. A convenient parameter τ is defined as the time taken for the ON current (measured at a drain voltage of 0.5 V and a gate voltage of 20 V ) to change by 30% after operation with a drain voltage of 20 V. A comparison will now be made for TFTs which had a length of 6 μm for the channel region 21 and a thickness of 0.15 μm for the gate dielectric 15. In some of these TFTs there was included a field-relief region having an unmodulated length of between 2 μm and 3 μm. For the TFTs with a film 20 deposited as columnar polycrystalline material, τ was less than 1 year ($4\times10^5$ minutes) without the field-relief region 22 and was considerably increased (by 2 orders of magnitude; calculated to be about $4\times10^7$ minutes, i.e. about 75 years) with the inclusion of such a field-relief region. For similar TFTs with a film 20 deposited as amorphous material which is then crystallized, τ was only about 10 days or less without the field-relief region 22 and was again increased by about 2 orders of magnitude by the inclusion of such a field-relief region. It is also possible to obtain a useful increase in τ by doubling or even trebling the length of the channel region 21, but the improvement in τ is less (and the increase in TFT size is more) than can be obtained by including a field-relief region 22 having a length of, for example, 1 μm to 3 μm.

Many modifications and variations are possible within the scope of the present invention. Thus, for example, in the embodiment of FIGS. 1 to 4, instead of depositing the highly doped layer 12, 13, 14, such a layer may be formed by implanting dopant ions in an upper surface portion of the intrinsic film 20. The implanted surface portion 14 is then etched away from the areas 1, 2, and 3, before the portions 12 and 13 are heated with the laser beam 40. The heating with the beam 40 serves to laterally diffuse the implanted dopant concentration into the second and third areas 2 and 3 of the semiconductor film 20 to form the regions 23 and 22. It also activates the implanted dopant concentration for the source and drain regions 13 and 12. However, the duration of the laser heating treatment (as determined by the total number of pulses to which each region is exposed) in order to achieve the desired extent of lateral diffusion is orders of magnitude higher than that required merely to activate the implanted dopant.

In the embodiments of FIGS. 1 to 11, the field-relief region 22 is formed between the channel region 21 and the drain region 12, and a similar low-doped region 23 is formed between the channel region 21 and the source region 13. The resulting TFT is symmetrical in operation with respect to its source and drain. At least most of the length of the low-doped region 23 is not modulated by the gate 16 in FIGS. 4, 6, and 11, and so its inclusion in the current path from the source region 13 increases the source resistance of the TFT. This increase in source resistance can be avoided by arranging the gate 16 such that it overlaps most of the low-doped region 23 of the source but does not overlap at least most of the field-relief region 22 of the drain. In an alternative form, the formation of region 23 is avoided or reduced, and the source region 23 extends laterally to the channel region 21. When the film 20 is already crystallized, the source region 13 and channel region 21 may be masked against direct heating by the laser beam 40 so that no laterally diffused region 23 is formed from the source region 13. In this case, only the drain region 12 and film area 2 are heated by the laser beam 40, so as to form the laterally-diffused region 22. In yet another alternative form, the source region 13 may be formed adjacent to the channel region 21 in a doping step which is separate from the doping step used to form the drain region 12, this separate doping step being carried out after heating the drain region 12 with the laser beam 40.

In the embodiments of FIGS. 1 to 11, the doping concentration of the drain region 12 is laterally diffused in the semiconductor film 20 to such an extent that the field relief region 22 occupies the whole length of the second area 2 between the channel region 21 and the drain region 12. However, particularly for a higher voltage device, it can be advantageous to provide a small gap between the laterally-diffused field-relief region 22 and the channel region 21. This gap may be of the intrinsic material of the film 21 and is not modulated by the gate 16. However a very large increase in drain series resistance can result. A field-plate or a second gate may be capacitively coupled to this intrinsic gap, in order to reduce this increase in drain series resistance.

In the embodiments of FIGS. 1 to 11, the gate 16 is formed at the upper face of film 20 remote from the substrate 10. However, a TFT in accordance with the present invention may have a gate 16 which is provided on the substrate 10 before depositing a gate insulating layer 15, after which the semiconductor film 20 is deposited. The source region 13, drain region 12 and field-relief region 22 are then subsequently formed in the film 20 by doping and heating with the laser beam 40.

The manufacture of N-channel TFTs has been illustrated with reference to the drawings. However the invention may also be used in the manufacture of P-channel devices having highly-doped P-type source and drain regions 13 and 12 with a lower-doped P-type field-relief region 22 formed by lateral diffusion from the drain region 12. In the embodiments described, the film 20 is of polycrystalline silicon. However TFTs may be manufactured in accordance with the invention in and on films 20 of amorphous silicon or of another disordered semiconductor material, for example cadmium selenide or sulphide.

A pulsed laser beam is a particularly convenient and precisely controllable energy source for the lateral diffusion. However, a different energy beam may be used, for example a high intensity ultraviolet lamp which is operated to give flash exposures of the thin-film structure 12, 13, 20.

From reading the present disclosure, other variations and modifications will be apparent to persons skilled in the art. Such variations and modifications may involve equivalent and other features which are already known in the design, manufacture and use of slectronic devices comprising TFTs and other semiconductor devices and component parts thereof and which may be used instead of or in addition to features already described herein.

We claim:

1. A method of manufacturing an electronic device comprising a thin-film field-effect transistor having a channel region in a first area of a semiconductor film between source and drain regions of the transistor, a gate coupled to the channel region for controlling current flow along a current path between the source and drain regions, and a field-relief region which is of lower doping concentration than the drain region and which is formed in the current path at an area where the channel region is laterally separated from the drain region, characterized in that a second area of the semiconductor film is provided for the current path where the channel region is laterally separated from the drain region, a lateral diffusion doping step is carried out by heating the drain region and the second area with an energy beam to an extent sufficient to form the field-relief region in this second area by laterally diffusing a doping concentration of the drain region into this second area of the semiconductor film along a distance which is larger than the thickness of the semiconductor film, and dopant ions are implanted in a surface portion of the semiconductor film to provide the doping concentration of the drain region, and the implanted surface portion is etched away from at least the second area of the semiconductor film before the lateral diffusion doping step with the energy beam.

2. A method as claimed in claim 1, further characterized in that the etching away is carried out at both the first and second areas of the semiconductor film, after which the gate is provided on an insulating layer on the first area of the semiconductor film.

3. A method as claimed in claim 1, further characterized in that the energy beam has an absorption depth in the drain region less than the thickness of the drain region.

4. A method as claimed in claim 3, further characterized in that the energy beam is of an ultraviolet wavelength generated by a pulsed excimer laser.

5. A method as claimed in claim 1, further characterized in that, after the lateral diffusion doping step with the energy beam, the doping concentrations of both the drain region and the field-relief region extend across the thickness of the semiconductor film.

6. A method as claimed in claim 1, further characterized in that the doping concentration of the drain region is laterally diffused in the semiconductor film to such an extent that the field-relief region occupies the whole length of the second area between the channel region and the drain region.

7. A method as claimed in claim 1, further characterized in that the etching away is carried out at both the first and second areas of the semiconductor film, after which the gate is provided on an insulating layer on the first area of the semiconductor film.

8. A method of manufacturing an electronic device comprising a thin-film field-effect transistor having a channel region in a first area of a semiconductor film between source and drain regions of the transistor, a gate coupled to the channel region for controlling current flow along a current path between the source and drain regions, and a field-relief region which is of lower doping concentration than the drain region and which is formed in the current path at an area where the channel region is laterally separated from the drain region, which method is characterized in that a second area of the semiconductor film is provided for the current path where the channel region is laterally separated from the drain region, a lateral diffusion doping step is carried out by heating the drain region and the second area with an energy beam to an extent sufficient to form the field-relief region in this second area by laterally diffusing a doping concentration of the drain region into this second area of the semiconductor film along a distance which is larger than the thickness of the semiconductor film, and an implantation mask comprising a gate layer is provided on an insulating layer on both the first and second areas of the semiconductor film, after which dopant ions are implanted in the semiconductor film to provide the doping concentration of the drain region while using the implantation mask to mask the first and second areas, and in that the gate is formed from the gate layer by etching away the gate layer from over the second area of the semiconductor film, which etching is carried out either before or after the lateral diffusion doping step with the energy beam.

9. A method as claimed in claim 8, further characterized in that the implantation mask comprises a resist layer on the gate layer, and the gate is formed by etching the gate layer from under an edge of the photoresist layer before the lateral diffusion doping step with the energy beam.

* * * * *